United States Patent
Kim et al.

(10) Patent No.: US 11,114,026 B2
(45) Date of Patent: Sep. 7, 2021

(54) DISPLAY APPARATUS COMPRISING COLOR ACCURACY ENHANCEMENT TRANSISTOR OR BRIGHTNESS BOOSTING TRANSISTOR

(71) Applicant: Samsung Display Co., Ltd., Yongin-si (KR)

(72) Inventors: Gun Hee Kim, Hwaseong-si (KR); Do Hyung Kim, Yongin-si (KR); Hyeonsik Kim, Yongin-si (KR); Sangho Park, Hwaseong-si (KR); Joo-Sun Yoon, Seoul (KR); Joohee Jeon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 231 days.

(21) Appl. No.: 16/295,361

(22) Filed: Mar. 7, 2019

(65) Prior Publication Data
US 2019/0279564 A1    Sep. 12, 2019

(30) Foreign Application Priority Data
Mar. 9, 2018 (KR) .................. 10-2018-0028265

(51) Int. Cl.
G09G 3/32 (2016.01)
H01L 27/32 (2006.01)
(Continued)

(52) U.S. Cl.
CPC ......... G09G 3/3225 (2013.01); G09G 3/3233 (2013.01); H01L 27/3262 (2013.01);
(Continued)

(58) Field of Classification Search
CPC ..... G09G 2320/0242; G09G 2320/045; G09G 2320/0626; G09G 3/3225; G09G 3/3233;
(Continued)

(56) References Cited

U.S. PATENT DOCUMENTS 6,534,788 B1   3/2003   Yeo et al.
6,963,173 B2   11/2005  Kawachi et al.
(Continued)

FOREIGN PATENT DOCUMENTS

JP   2005-4183     1/2005
JP   2006-091089 A 4/2006
(Continued)

OTHER PUBLICATIONS

Partial European Search Report for Application No. 19161540.0; dated Jun. 28, 2019.
(Continued)

*Primary Examiner* — Didarul A Mazumder
(74) *Attorney, Agent, or Firm* — Kile Park Reed & Houtteman PLLC

(57) ABSTRACT

A display apparatus includes a plurality of pixels, each of the pixels including an organic light emitting diode, a first transistor providing a driving current to operate the organic light emitting diode, a second transistor including a gate electrode that receives a first scan signal, a first electrode that receives a data signal, and a second electrode electrically connected to the first electrode of the first transistor, a storage capacitor including a first electrode receiving a first power voltage and a second electrode electrically connected to the gate electrode of the first transistor, and a color accuracy enhancement transistor that applies a first back bias voltage to the first transistor in response to a color accuracy enhancement signal.

18 Claims, 7 Drawing Sheets

(51) Int. Cl.
*G09G 3/3225* (2016.01)
*G09G 3/3233* (2016.01)

(52) U.S. Cl.
CPC .............. *G09G 2300/043* (2013.01); *G09G 2300/0819* (2013.01); *G09G 2300/0842* (2013.01); *G09G 2300/0861* (2013.01); *G09G 2320/0233* (2013.01); *G09G 2320/0242* (2013.01); *G09G 2320/045* (2013.01); *G09G 2320/0626* (2013.01)

(58) Field of Classification Search
CPC .......... G09G 2300/0819; G09G 3/3266; H01L 27/3262; H01L 27/3246; H01L 29/78633
USPC ....................................... 257/40; 438/82, 99
See application file for complete search history.

(56) References Cited

U.S. PATENT DOCUMENTS

| | | | |
|---|---|---|---|
| 8,842,231 B2 | 9/2014 | Liu et al. | |
| 9,530,800 B2 | 12/2016 | Wang et al. | |
| 9,673,267 B2 | 6/2017 | Kim et al. | |
| 2005/0179625 A1* | 8/2005 | Choi ................... | G09G 3/3233 345/76 |
| 2006/0022909 A1* | 2/2006 | Kwak ................. | G09G 3/3233 345/76 |
| 2007/0075938 A1* | 4/2007 | Sung ................... | G09G 3/3233 345/76 |
| 2007/0152919 A1 | 7/2007 | Tseng et al. | |
| 2007/0264899 A1* | 11/2007 | Kumagai ............ | H01L 27/3246 445/24 |
| 2008/0094320 A1* | 4/2008 | Parikh ................ | G09G 3/3266 345/76 |
| 2014/0071027 A1* | 3/2014 | Jin ..................... | G09G 3/3233 345/76 |
| 2015/0339974 A1* | 11/2015 | Wu ..................... | G09G 3/3233 345/690 |
| 2015/0364076 A1* | 12/2015 | Park ................... | G09G 3/2081 345/77 |
| 2015/0379923 A1* | 12/2015 | Lee .................... | G09G 3/3233 345/206 |
| 2018/0040274 A1 | 2/2018 | Kurokawa | |
| 2018/0145123 A1* | 5/2018 | Kim, II ............. | H01L 29/78633 |

FOREIGN PATENT DOCUMENTS

| | | |
|---|---|---|
| KR | 10-2011-0069397 A | 6/2011 |
| KR | 10-2014-0080729 A | 7/2014 |

OTHER PUBLICATIONS

Extended European Search Report corresponding to European Application or Patent No. 20178217.4 dated Jul. 22, 2020.

* cited by examiner

FIG. 4

| MODE | CA TFT (Ta) | HBM TFT (Tb) |
|---|---|---|
| NORMAL MODE | OFF | OFF |
| COLOR ACCURACY MODE | ON | OFF |
| HIGH BRIGHTNESS MODE | OFF | ON |

DISPLAY APPARATUS COMPRISING COLOR ACCURACY ENHANCEMENT TRANSISTOR OR BRIGHTNESS BOOSTING TRANSISTOR

CROSS-REFERENCE TO RELATED APPLICATION

Korean Patent Application No. 10-2018-0028265 filed on Mar. 9, 2018, in the Korean Intellectual Property Office, and entitled: "Display Apparatus," is incorporated by reference herein in its entirety.

BACKGROUND

1. Field

Embodiments relate to a display apparatus.

2. Description of the Related Art

A display apparatus having light weight and small size has been manufactured. A cathode ray tube (CRT) display apparatus has been used due to a performance and a competitive price. However the CRT display apparatus has a weakness with a size or portability. Therefore a display apparatus such as a plasma display apparatus, a liquid crystal display apparatus, and an organic light emitting display apparatus has been highly regarded due to small size, light weight, and low-power-consumption.

SUMMARY

Embodiments are directed to a display apparatus, including a plurality of pixels, each of the pixels including an organic light emitting diode, a first transistor providing a driving current to operate the organic light emitting diode, a second transistor including a gate electrode that receives a first scan signal, a first electrode that receives a data signal, and a second electrode electrically connected to the first electrode of the first transistor, a storage capacitor including a first electrode receiving a first power voltage and a second electrode electrically connected to the gate electrode of the first transistor, and a color accuracy enhancement transistor that applies a first back bias voltage to the first transistor in response to a color accuracy enhancement signal.

The color accuracy enhancement transistor may include a gate electrode, a first electrode, and a second electrode, and the first electrode may receive the data signal or the first power voltage.

The gate electrode of the color accuracy enhancement transistor may receive the color accuracy enhancement signal, the first electrode of the color accuracy enhancement transistor may be electrically connected to the first transistor, and the second electrode of the color accuracy enhancement transistor may be electrically connected to a back bias electrode of the first transistor.

The first electrode of the color accuracy enhancement transistor may be electrically connected to the first power voltage.

The first electrode of the color accuracy enhancement transistor may be electrically connected to the first electrode of the first transistor.

Each of the pixels may further include a brightness boosting transistor that applies a second back bias voltage to the first transistor in response to a brightness boosting signal.

The brightness boosting transistor may include a gate electrode, a first electrode, and a second electrode, and the first electrode may receive a gate voltage of the first transistor.

The gate electrode of the brightness boosting transistor may receive the brightness boosting signal, the first electrode of the brightness boosting transistor may be electrically connected to the first transistor, and the second electrode of the brightness boosting transistor may be electrically connected to the back bias electrode of the first transistor.

The first electrode of the first brightness boosting transistor may be electrically connected to the gate electrode of the first transistor.

The first electrode of the first brightness boosting transistor may be electrically connected to the second electrode of the second transistor and the second electrode of the storage capacitor.

When the color accuracy enhancement transistor is turned on by the color-accuracy-enhancement signal, the brightness boosting transistor may be turned off by the brightness-boosting signal, and, when the brightness boosting transistor is turned on by the brightness-boosting signal, the color accuracy enhancement transistor may be turned off by the color-accuracy-enhancement signal.

Embodiments are also directed to a display apparatus, including a plurality of pixels, each of the pixels including an organic light emitting diode, a first transistor providing a driving current to operate the organic light emitting diode, a second transistor including a gate electrode that receives a first scan signal, a first electrode that receives a data signal, and a second electrode electrically connected to the first electrode of the first transistor, and a brightness boosting transistor that applies a second back bias voltage to the first transistor in response to a brightness boosting signal.

The brightness boosting transistor may include a gate electrode that receives the brightness boosting signal, a first electrode electrically connected to the first transistor, and a second electrode electrically connected to a back bias electrode of the first transistor.

The first electrode of the brightness boosting transistor may receive a gate voltage of the first transistor.

Each of the pixels may further include a color accuracy enhancement transistor that applies a first back bias voltage to the first transistor in response to a color accuracy enhancement signal.

Embodiments are also directed to a display apparatus, including a base substrate, a back bias electrode on the base substrate, a first transistor including a first active pattern overlapping the back bias electrode and a first gate electrode overlapping the first active pattern, a first electrode electrically connected to the first transistor, a second electrode facing the first electrode, a light emitting layer disposed between the first electrode and the second electrode, a color accuracy enhancement transistor electrically connected to the back bias electrode, and a brightness boosting transistor electrically connected to the back bias electrode.

The back bias electrode may be electrically connected to a drain electrode of the color accuracy enhancement transistor and a drain electrode of the brightness boosting transistor.

The display apparatus may further include a buffer layer disposed between the back bias electrode and the first transistor.

The display apparatus may further include a mode selector that provides the color accuracy enhancement signal to a gate electrode of the color accuracy enhancement transistor, and provides a brightness boosting signal to a gate electrode of the brightness boosting transistor.

The brightness boosting signal may have an off voltage that turns off the brightness boosting transistor when the color accuracy enhancement signal has an on voltage that turns on the color accuracy enhancement transistor, and the color accuracy enhancement signal may have an off voltage that turns off the color accuracy enhancement transistor when the brightness boosting signal has an on voltage to turn on the brightness boosting transistor.

BRIEF DESCRIPTION OF THE DRAWINGS

Features will become apparent to those of skill in the art by describing in detail example embodiments with reference to the attached drawings in which:

FIG. 4 illustrates a table showing an operation of a color accuracy enhancement transistor and a brightness boosting transistor according to modes of the display apparatus of FIG. 1;

DETAILED DESCRIPTION

Figure 1:
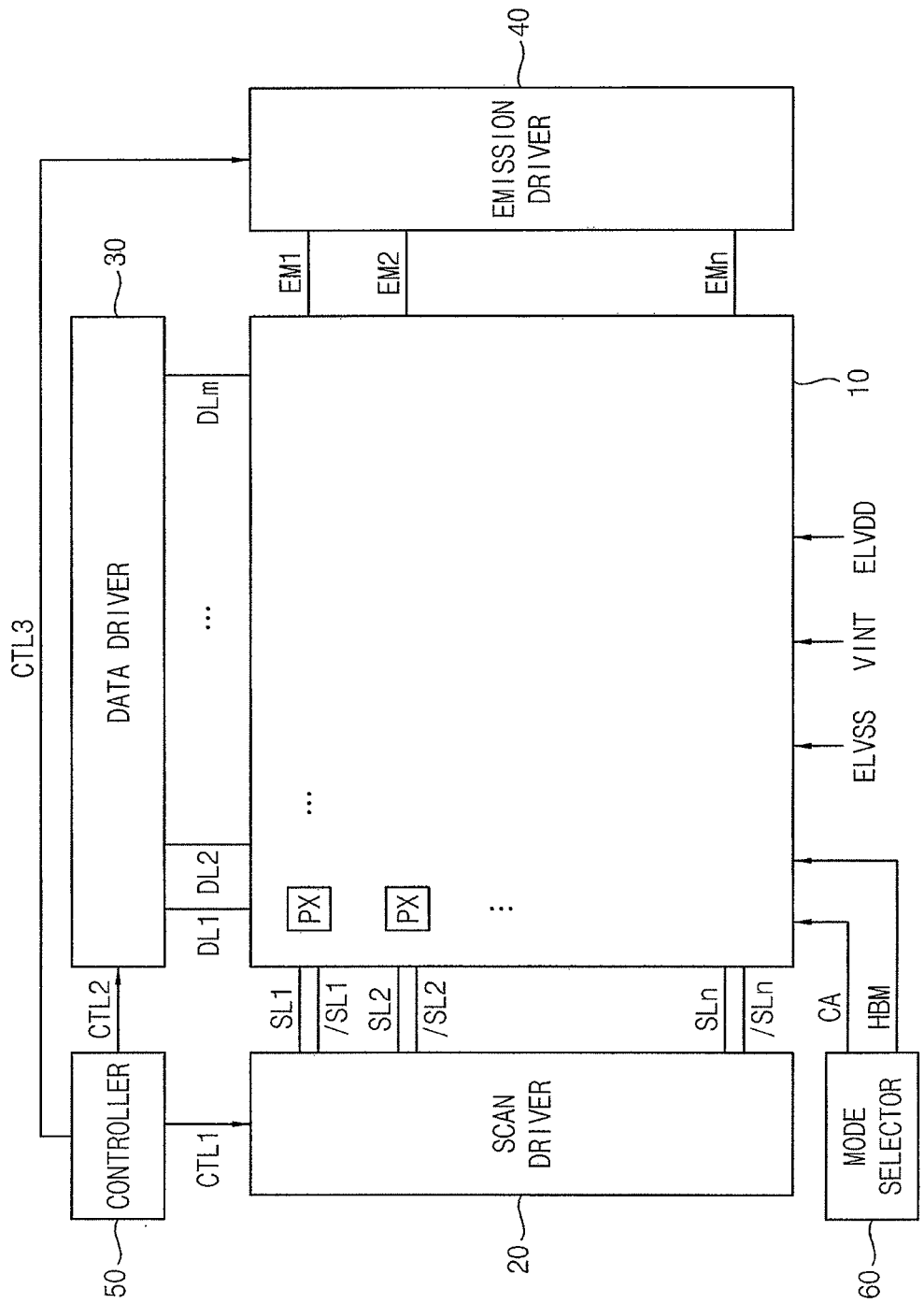
FIG. 1 illustrates a block diagram of a display apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. Like reference numerals refer to like elements throughout.

FIG. 1 illustrates a block diagram of a display apparatus according to an example embodiment.

The display apparatus may include a display panel 10, a scan driver 20, a data driver 30, an emission control driver 40, a controller 50, and a mode selector 60.

The display panel 10 may include a plurality of pixels PX to display an image. For example, the display panel 10 may include n*m pixels PX in which pixels PX are arranged at locations corresponding to crossing points of scan lines SL1 through SLn and data lines DL1 through DLm, where n and m are integers greater than 1. Each of the pixels PX may include a driving transistor and a plurality of switching transistors. Example circuits of the pixel PX are described in detail in connection with FIGS. 2 and 5.

The scan driver 20 may progressively provide a first scan signal to the pixels PX via the scan lines SL1 through SLn based on a first control signal CTL1. The scan driver 20 may progressively provide a second scan signal to the pixels PX via inverted scan lines /SL1 through /SLn based on a first control signal CTL1. For example, the second scan signal may correspond to a signal inverted relative to the first scan signal.

The data driver 30 may provide a data signal to the pixels PX via the data lines DL1 through DLm based on a second control signal CTL2.

The emission control driver 40 may provide an emission control signal to the pixels PX via the emission control lines EM1 through EMn based on a third control signal CTL3.

The controller 50 may control the scan driver 20, the data driver 30, and the emission control driver 40. The controller 50 may generate the control signals CTL1, CTL2, CTL3 to control the scan driver 20, the data driver 30, and the emission control driver 40. The first control signal CTL1 for controlling the scan driver 20 may include a vertical start signal, scan clock signals, etc. The second control signal CTL2 for the controlling the data driver 30 may include digital image data, a horizontal start signal, etc. The third control signal CTL3 for the controlling the emission control driver 40 may include an emission control start signal, emission control clock signals, etc.

The mode selector 60 may generate a color accuracy enhancement signal CA and a brightness boosting signal HBM and prove them the pixels PX. The mode selector 60 may generate the color accuracy enhancement signal CA and the brightness boosting signal HBM according user's mode selection, and provide the generated color accuracy enhancement signal CA and the brightness boosting signal HBM to the pixels PX of the display panel 10. In an example embodiment, the mode is one of a normal mode, a color accuracy mode and a high brightness mode (HBM mode), and one of these modes may be selected. Accordingly, the mode selector 60 may appropriately generate the color correcting enhancement signal CA and the brightness boosting signal HBM to provide them to the pixel PX of the display panel 10. Details of this are described below in connection with FIG. 4.

In addition, the display apparatus may further include a power supply unit for supplying the display panel 10 with a first power supply voltage ELVDD, a second power supply voltage ELVSS, and an initialization voltage VINT.

Figure 2:
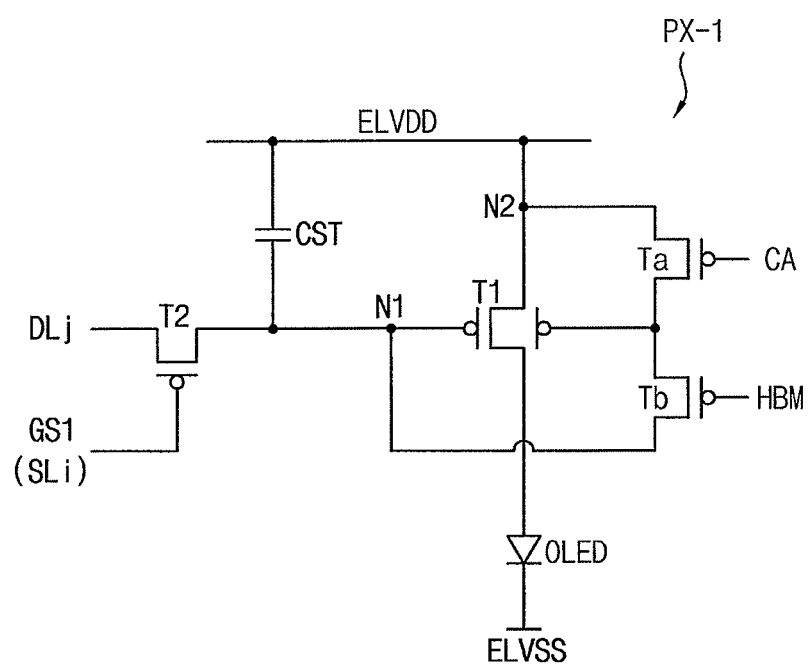
FIG. 2 illustrates an equivalent circuit diagram of an example of a pixel included in the display apparatus of FIG. 1.

FIG. 2 illustrates an equivalent circuit diagram of an example of a pixel included in the organic light emitting display apparatus of FIG. 1.

Referring to FIG. 2, the pixel PX-1 may include first and second transistors T1 and T2, a storage capacitor CST, an organic light emitting diode OLED, a color accuracy enhancement transistor Ta, and a brightness boosting transistor Tb.

The pixel PX-1 may be located at the (i)th pixel row and the (j)th pixel column, where i is an integer between 1 and n, and j is an integer between 1 and m.

The first transistor T1 may be a driving transistor providing a driving current corresponding to a data signal to the organic light emitting diode OLED. The first transistor T1 may include a gate electrode connected to the first node N1, a first electrode connected to the second node N2, and a second electrode connected to the organic light emitting diode OLED.

The first power voltage ELVDD may be provided to the first transistor T1, which may be connected to the storage capacitor CST. The first transistor T1 may control the driving current flowing from the first power voltage ELVDD through the organic light emitting diode OLED corresponding to a voltage value stored in the storage capacitor CST.

The second transistor T2 may provide a data signal to the first transistor T1 in response to a first scan signal GS1. The second transistor T2 may be a switching transistor. In an example embodiment, the second transistor T2 may include a gate electrode receiving the first scan signal GS1 from the (i)th scan line SLi, a first electrode receiving the data signal from the (j)th data line DLj, and a second electrode connected to the gate electrode of the first transistor T1.

The storage capacitor CST may include a first electrode receiving the first power voltage ELVDD and a second electrode connected to the gate electrode of the first transistor T1 (for example at the first node N1). The storage capacitor CST may store a voltage corresponding to a difference between a voltage received from the second transistor T2 and the first power voltage ELVDD.

The organic light emitting diode OLED may emit light having a predetermined luminance according to the driving current.

The color accuracy enhancement transistor Ta may include a gate electrode receiving a color accuracy enhancement signal CA from the mode selector 60, a first electrode connected to the first electrode of the first transistor T1 and the first power supply voltage ELVDD (for example at the second node N2), and a second electrode connected to a back bias electrode (see BVE of FIG. 3), which may be used for applying a back bias voltage to the first transistor T1.

In a color accuracy mode, the color accuracy enhancement transistor Ta may apply the first power supply voltage ELVDD as the back bias voltage of the first transistor T1 in response to the color accuracy enhancement signal CA. At this time, the brightness boosting transistor Tb may be off.

The brightness boosting transistor Tb may include a gate electrode receiving the brightness boosting signal HBM from the mode selector 60, a first electrode connected to the gate electrode of the first transistor T1 and the second electrode of the second transistor T2 (for example at the first node N1), and a second electrode connected to the back bias electrode BVE.

In a high brightness mode, the brightness boosting transistor Tb may apply a gate voltage of the first transistor T1 (a voltage of the first node N1) as the back bias voltage to the first transistor T1 in response to the brightness boosting signal HBM. At this time, the color accuracy enhancement transistor Ta may be off.

According to the present example embodiment, the pixel of the display apparatus may include the color accuracy enhancement transistor Ta that applies the first power voltage ELVDD to the back bias voltage of the first transistor T1 in response to the color accuracy improvement signal CA. Thus, color accuracy of the image displayed by the display apparatus may be improved.

In addition, the pixel of the display apparatus may include the brightness boosting transistor Tb that applies the gate voltage of the first transistor T1 to the back bias voltage of the first transistor T1 in response to the brightness boosting signal HBM. Accordingly, the brightness of the image displayed by the display apparatus may be boosted.

Figure 3:
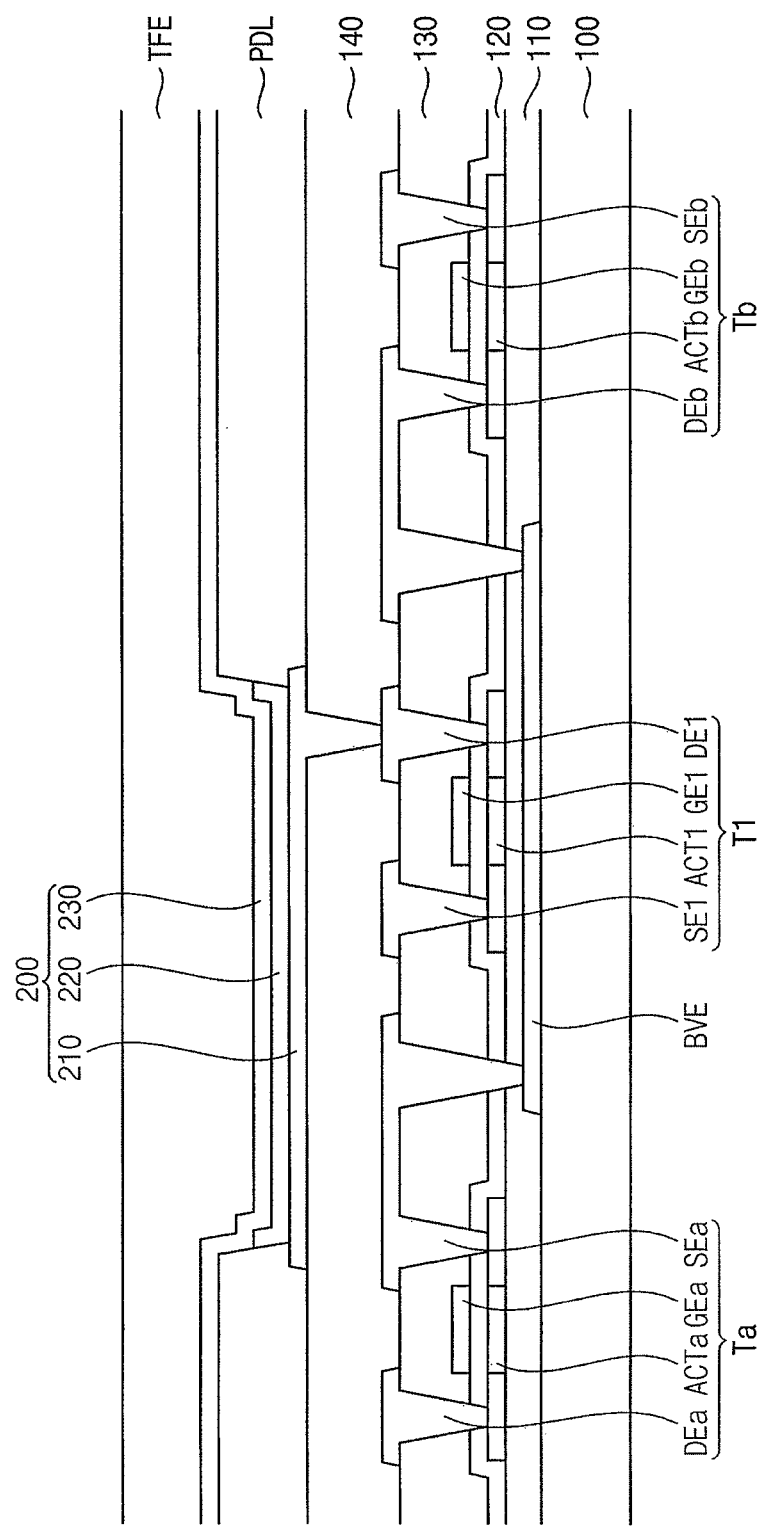
FIG. 3 illustrates a cross-sectional view of the display apparatus of FIG. 1.

FIG. 3 illustrates a cross-sectional view of the display apparatus of FIG. 1.

Referring to FIG. 3, the display apparatus may include a base substrate 100, the back bias electrode BVE, a buffer layer 110, an active pattern layer, a first insulation layer 120, a first gate pattern layer, a second insulation layer 130, a first source drain pattern layer, a third insulation layer 140, a first electrode 210, a light emitting layer 220, a second electrode 230, and a thin film encapsulation layer TFE.

The base substrate 100 may include transparent or opaque insulation materials. For example, the base substrate 100 may include a quartz substrate, a synthetic quartz substrate, a calcium fluoride substrate, a fluoride-doped quartz substrate, a sodalime glass substrate, a non-alkali glass substrate etc. In another implementation, the base substrate 100 may include a flexible transparent material such as a flexible transparent resin substrate (e.g., a polyimide substrate). In this case, the polyimide substrate may include a first polyimide layer, a barrier film layer, a second polyimide layer, etc. For example, the polyimide substrate may have a configuration where the first polyimide layer, the barrier film layer, and the second polyimide layer, are stack on the a rigid glass substrate. The polyimide substrate may be relatively thin and flexible. Thus, the polyimide substrate may be formed on a rigid glass substrate to help support the formation of an upper structure (e.g., the thin film transistor, the light emitting structure, etc.). In a manufacturing the display apparatus, after an insulation layer (e.g., a buffer layer) is provided on the second polyimide layer of the polyimide substrate, the upper structure may be formed on the insulation layer. After the upper structure is formed on the buffer layer, the rigid glass substrate on which the polyimide substrate is formed may be removed. It may be difficult to directly form the upper structure on the polyimide substrate if the polyimide substrate is relatively thin and flexible. Accordingly, the upper structure may be formed on the polyimide substrate and the rigid glass substrate, and then the polyimide substrate may serve as the base substrate 100 after the removal of the rigid glass substrate.

The back bias electrode BVE may be disposed on the base substrate 100. The back bias electrode BE may be formed by using a metal, an alloy, a metal nitride, a conductive metal oxide, or a transparent conductive material as an electrode for applying a back bias voltage to the first transistor T1.

The buffer layer 110 may be disposed entirely on the base substrate 110 on which the back bias electrode BVE is disposed. The buffer layer 110 may prevent diffusion of metal atoms and/or impurities from the base substrate 100. Additionally, the buffer layer 110 may adjust heat transfer rate of a successive crystallization process for the active pattern layer, to help provide a substantially uniform the active pattern layer. For example, the buffer layer 110 may include an organic or inorganic material.

The buffer layer 110 may cover the back bias electrode BVE on the base substrate 100 and may have a substantially flat upper surface without a step portion around the back bias electrode BVE. In an example embodiment, the buffer layer 110 may be disposed at substantially the same thickness along a profile of the back bias electrode BVE.

The active pattern layer may be disposed on the buffer layer 110. The active pattern layer may include a first active pattern ACT1, a color accuracy enhancement active pattern ACTa, and a brightness boosting active pattern ACTa.

The active pattern layer may include amorphous silicon or may include polycrystalline silicon. In example embodiments, the active pattern layer may include, for example, an oxide of at least one of In, Ga, Sn, Zr, V, Hf, Cd, Ge, Cr, Ti, and Zn. Each of the first active pattern ACT1, the color accuracy enhancement active pattern ACTa, and the brightness boosting active pattern ACTb may include a channel region and source and drain regions doped with an impurity.

The first insulation layer 120 may be disposed on the buffer later 110 on which the active pattern layer is disposed. For example, the first insulation layer 120 may be uniformly formed on the buffer layer 110 along a profile of the gate pattern. In some example embodiments, the first insulation layer 120 may have a relatively large thickness for covering the gate pattern, so that the first insulation layer 120 may have a substantially level surface. The first insulating layer 120 may be formed using an inorganic insulating material such as silicon oxide or metal oxide. For example, the first insulating layer 120 may be formed using silicon oxide ($SiO_x$), silicon nitride ($SiN_x$), silicon oxynitride ($SiO_xN_y$), aluminum oxide ($AlO_x$), tantalum oxide ($TaO_x$), hafnium oxide ($HfO_x$), zirconium oxide ($ZrO_x$), titanium oxide ($TiO_x$), etc. These may be used alone or in a combination thereof.

The first gate pattern layer may be disposed on the first insulation layer 120. The first gate pattern layer may include a first gate electrode GE1, a color accuracy enhancement gate electrode GEa, a brightness boosting gate electrode GEb, and a signal line such as a scan line. The first gate pattern layer may be formed using a metal, an alloy, a metal nitride, a conductive metal oxide, or the like.

The second insulation layer 130 may be disposed on the first insulation layer 120 on which the first gate pattern layer is disposed. For example, the second insulation layer 130 may be uniformly formed on the first insulation layer 120 along a profile of the gate pattern layer. In some example embodiments, the second insulation layer 130 may have a relatively large thickness for covering the gate pattern layer, so that the second insulation layer 130 may have a substantially level surface. The second insulating layer 130 may be formed using an inorganic insulating material such as silicon oxide or metal oxide. For example, the second insulating layer 130 may be formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. The second insulating layer 130 may be formed of a plurality of layers.

The first source drain pattern layer may be disposed on the second insulation layer 130. The first source drain pattern layer may include a first source electrode SE1, a first drain electrode DE1, a color accuracy enhancement source electrode SEa, a color accuracy enhancement drain electrode DEa, a brightness boosting source electrode SEb, a brightness boosting drain electrode DEb, and a signal wiring such as a data line. The first source drain pattern layer may be formed using a metal, an alloy, a metal nitride, a conductive metal oxide, or the like.

The first source electrode SE1 and the first drain electrode DE1 may be electrically connected to the source and the drain regions of the first active pattern ACT1 through contact holes formed through the first insulating layer 120 and the second insulating layer 130, respectively.

The color accuracy enhancement source electrode SEa and the color accuracy enhancement drain electrode DEa may be electrically connected to the source region and the drain region of the color accuracy enhancement active pattern ACTa through the contact holes formed through the first insulation layer 120 and the second insulation layer 130, respectively.

The brightness boosting source electrode SEb and the brightness boosting drain electrode DEb may be electrically connected to the source region and the drain region of the brightness boosting active pattern ACTb through the contact holes formed through the first insulation layer 120 and the second insulation layer 130, respectively.

In addition, the color accuracy enhancement drain electrode DEa and the brightness boosting drain electrode DEb may be electrically connected to the back bias electrode BVE through contact holes formed through the buffer layer 110, the first insulation layer 120 and the second insulation layer 130.

The first active pattern ACT1, the first gate electrode GE1, the first source electrode SE1, and the first drain electrode SE1 may be included in a first transistor T1, which is a driving transistor. The color accuracy enhancement active pattern ACTa, the color accuracy enhancement gate electrode GEa, the color accuracy enhancement source electrode SEa, and the color accuracy enhancement drain electrode DEa may be included in the color accuracy enhancement transistor Ta. The brightness boosting active pattern ACTb, the brightness boosting gate electrode GEb, the brightness boosting source electrode SEb, and the brightness boosting drain electrode DEb may be included in the brightness boosting transistor Tb.

The third insulation layer 140 may be disposed on the first source drain pattern layer. The third insulation layer 140 may have a single-layer structure, or may have a multi-layer structure including at least two insulating layers. In example embodiments, the third insulation layer 140 may include organic materials such as polyimide, epoxy-based resin, acryl-based resin, polyester, photoresist, polyacryl-based resin, polyimide-based resin, a polyamide-based resin, a siloxane-based resin, etc. In some example embodiments, the third insulation layer 140 may include inorganic material such as silicon compounds, metals, and metal oxides.

The first electrode 210 may be disposed on the third insulating layer 140. The first electrode 210 may be connected to the first drain electrode DE1 of the first transistor T1 through a contact hole formed through the third insulating layer 140.

The first electrode 210 may include a reflective material or a transmissive material in accordance with the emission type of the display apparatus. For example, the first electrode 210 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the first electrode 210 may have a single layer structure or a multi layer structure, which may include a metal film, an alloy film, a metal nitride film, a conductive metal oxide film, and/or a transparent conductive film.

The pixel defining layer PDL may be disposed on the third insulation layer 140 on which the first electrode 210 is disposed. The pixel defining layer PDL may define an opening which exposes the first electrode 210. The pixel defining layer PDL may include an organic material or an inorganic material. For example, the pixel defining layer PDL may be formed using photoresist, acryl-based resin, polyacryl-based resin, polyimide-based resin, a silicon compound, etc. In an example embodiment, the pixel defining layer PDL may be etched to form an opening for partially exposing the first electrode 210. An emission region and a non-emission region of the display apparatus may be defined by the opening of the pixel defining layer PDL. For example, a portion where the opening of the pixel defining layer PDL is located may correspond to the emission region, and the non-emission region may correspond to a portion adjacent to the opening of the pixel defining layer PDL.

The light emitting layer 220 may be positioned on the first electrode 210 exposed by the opening of the pixel defining layer PDL. The light emitting layer 220 may extend on a sidewall of the opening of the pixel defining layer PDL. The light emitting layer 220 may be formed by a laser induced thermal imaging process, a printing process, etc. The light emitting layer 220 may include an organic light emitting layer (EL), a hole injection layer (HIL), a hole transfer layer (HTL), an electron transfer layer (ETL), an electron injection layer (EIL), etc. In example embodiments, a plurality of organic light emitting layers may be formed using light emitting materials for generating different colors of light such as a red color of light (R), a green color of light (G), and a blue color of light (B) in accordance with color pixels of the display apparatus. In some example embodiments, the organic light emitting layer of the of the light emitting layer 220 may include a plurality of stacked light emitting materials for generating a red color of light, a green color of light, and a blue color of light to thereby emit a white color of light. The light emitting structures may be commonly formed so as to correspond to a plurality of pixels, and each pixel may be divided by a color filter layer.

The second electrode 230 may be disposed on the pixel defining layer PDL and the light emitting layer 220. The second electrode 230 may include a transmissive material or a reflective material in accordance with the emission type of the display device. For example, the second electrode 230 may be conductive and may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the second electrode 230 may also have a single layer structure or a multi layer structure, which may include a metal film, an alloy film, a metal nitride film, a conductive metal oxide film, and/or a transparent conductive film.

The first electrode 210, the light emitting layer 220, and the second electrode 230 may form a light emitting structure 200.

The thin film encapsulation layer TFE may be disposed on the second electrode 230. The thin film encapsulation layer TFE may prevent penetration of moisture and oxygen from outside. The thin film encapsulation layer TFE may have at least one organic layer and at least one inorganic layer. The at least one organic layer and the at least one inorganic layer may be alternately stacked with each other. For example, the thin film encapsulation layer TFE may include two inorganic layers and one organic layer therebetween, etc. In some example embodiments, an encapsulation substrate may be provided for shielding outside air and moisture from penetrating into the display apparatus in place of the thin film encapsulation layer.

FIG. 4 illustrates a table showing an operation of a color accuracy enhancement transistor and a brightness boosting transistor according to modes of the display apparatus of FIG. 1.

Referring to FIGS. 1, 2, and 4, the display apparatus may have a normal mode, a color accuracy mode, and a high brightness mode. The normal mode may correspond to a standard of display quality. In the color accuracy enhancement mode, dispersion of characteristics of driving transistors of the pixels of the display apparatus may be reduced, so that display quality of the display apparatus may be improved. In the high brightness mode, Id (drain current) of the driving transistor of the pixels may increase, so that brightness of the display apparatus may be increased.

In an example embodiment, in the normal mode, both the color accuracy enhancement transistor Ta and the brightness boosting transistor Tb are off, for example, the color accuracy enhancement signal and the brightness boosting signal may have an off voltage. The display quality of the image displayed in the normal mode may correspond to a reference display quality.

In an example embodiment, in the color accuracy mode, the color accuracy enhancement transistor Ta is on and the brightness boosting transistor Tb is off, for example, the color accuracy enhancement signal may have on voltage and the brightness boosting signal may have off voltage. In the color accuracy mode, the color accuracy enhancement transistor Ta may provide the first power voltage ELVDD as a back bias voltage to the first transistor T1 (which is a driving transistor) so that dispersion of Ids (drain-source current) may be reduced. Accordingly, deviations of driving current for the pixels may be reduced, and the image to be displayed may be displayed more accurately and the display quality may be improved.

In an example embodiment, in the high brightness mode, the color accuracy enhancement transistor Tb is off and the brightness boosting transistor Tb is on, for example, the color accuracy enhancement signal may have off voltage and the brightness boosting signal may have on voltage. In the high brightness mode, the brightness boosting transistor Tb provides the gate voltage of the first transistor T1 (the voltage of the first node N1) as a bias voltage of the first transistor T1 (which is the driving transistor), and Id (drain current) corresponding to Vg (gate voltage) of the driving transistor is increased, so that the brightness of the display apparatus may be increased.

According to an example embodiment, it may be possible to improve the display quality in the color accuracy mode, increase the brightness in the high brightness mode, and the color accuracy mode and the high brightness mode may be selected by user's choice or automatically selected according to surrounding environment. For example, the high brightness mode may be selected in a bright environment of external light, and the color accuracy mode may be selected in a dark environment of external light. In addition, the mode switching may be configured to be automatically switched using an illuminance sensor or the like.

Figure 5:
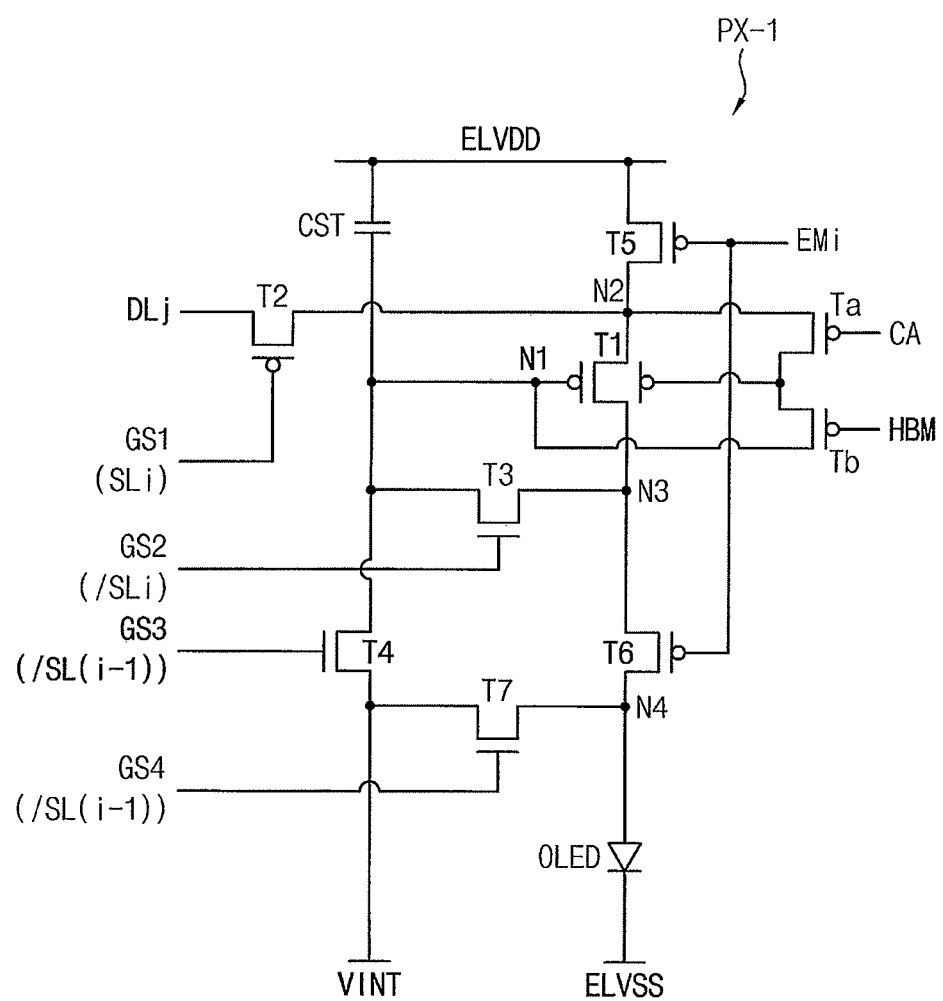
FIG. 5 illustrates an equivalent circuit diagram of an example of a pixel included in a display apparatus according to an example embodiment.

FIG. 5 illustrates an equivalent circuit diagram of an example of a pixel included in a display apparatus according to an example embodiment.

Referring to FIG. 5, the pixel PX-1 may include first through seventh transistors T1 through T7, a storage capacitor CST, an organic light emitting diode OLED, a color accuracy enhancement transistor Ta, and a brightness boosting transistor Tb. The pixel PX-1 may be located at the (i)th pixel row and the (j)th pixel column, where i is an integer between 1 and n, and j is an integer between 1 and m.

The first transistor T1 may be a driving transistor providing a driving current corresponding to a data signal to the organic light emitting diode OLED. The first transistor T1 may include a gate electrode connected to the first node N1, a first electrode connected to the second node N2, and a second electrode connected to the third node N3.

The second transistor T2 may provide a data signal to the first transistor T1 in response to a first scan signal GS1. In an example embodiment, the second transistor T2 may include a gate electrode receiving the first scan signal GS1 from the (i)th scan line SLi, a first electrode receiving the data signal from the (j)th data line DLj, and a second electrode connected to the first electrode of the first transistor T1 (for example, at the second node N2).

The third transistor T3 may connect the second electrode of the first transistor T1 to the gate electrode of the first transistor T1 in response to a second scan signal GS2. In an example embodiment, the third transistor T3 may include a gate electrode receiving the second scan signal GS2 from the (i)th inverted scan line /SLi, a first electrode connected to the second electrode of the first transistor T1 (for example, at the third node N3), and a second electrode connected to the gate electrode of the first transistor T1 (for example, at the first node N1).

The fourth transistor T4 may apply the initialization voltage VINT to the gate electrode of the first transistor T1 in response to a third scan signal GS3. In an example embodiment, the fourth transistor T4 may include a gate electrode receiving the third scan signal GS3 from the (i−1)th inverted scan line /SL(i−1), a first electrode receiving the initialization voltage VINT, and a second electrode connected to the gate electrode of the first electrode T1 (for example, at the first node N1).

The fifth transistor T5 may apply the first power voltage ELVDD to the first electrode of the first transistor T1 in response to the emission control signal. In an example embodiment, the fifth transistor T5 may include a gate electrode receiving the emission control signal from the (i)th emission control line EMi, a first electrode receiving the first power voltage ELVDD, and a second electrode connected to the first electrode of the first transistor T1 (for example, at the second node N2).

The sixth transistor T6 may connect the second electrode of the first transistor T1 to the first electrode of the organic light emitting diode OLED in response to the emission control signal. In an example embodiment, the sixth transistor T6 may include a gate electrode receiving the emission control signal from the (i)th emission control line EMi, a first electrode connected to the second electrode of the first transistor T1 (for example, at the third node N3), and a second electrode connected to the first electrode of the organic light emitting diode OLED (for example, at a fourth node N4).

The seventh transistor T7 may apply the initialization voltage VINT to the first electrode of the OLED in response to the fourth scan signal GS4. In an example embodiment, the seventh transistor T7 may include a gate electrode receiving the fourth scan signal GS4 from the (i−1)th inverted scan line /SL(i−1), a first electrode receiving the initialization voltage VINT, and a second electrode connected to the first electrode of the OLED (for example, at fourth node N4).

The third to seventh transistors T3 to T7 may be circuit configuration transistors.

The storage capacitor CST may include a first electrode receiving the first power voltage ELVDD and a second electrode connected to the gate electrode of the first transistor T1 (for example, at first node N1).

The color accuracy enhancement transistor Ta may include the gate electrode for receiving the color correcting enhancement signal CA from the mode selector 60, the first electrode connected to the first electrode of the first transistor T1 (for example, at second node N2), and the second electrode connected to a back bias electrode BVE for applying a back bias voltage to the first transistor T1.

In a color accuracy mode, the color accuracy enhancement transistor Ta may apply a data signal or the first power supply voltage ELVDD as the back bias voltage of the first transistor T1 in response to the color accuracy enhancement signal CA. At this time, the brightness boosting transistor Tb may be off.

The brightness boosting transistor Tb may include the gate electrode for receiving the brightness boosting signal HBM from the mode selector 60, the first electrode connected to the gate electrode of the first transistor T1 (for example, at first node N1), and a second electrode connected to the back bias electrode BVE for applying the back bias voltage to the first transistor T1.

In a high brightness mode, the brightness boosting transistor Tb may apply a gate voltage of the first transistor T1 (a voltage of the first node N1) as the back bias voltage to the first transistor T1 in response to the brightness boosting signal HBM. At this time, the color accuracy enhancement transistor Ta may be off.

According to the present example embodiment, the pixel of the display apparatus may include the color accuracy enhancement transistor Ta that applies the data signal or the first power supply voltage ELVDD as the back bias voltage of the first transistor T1 in response to the color accuracy enhancement signal CA. Accordingly, the color accuracy of the image displayed by the display apparatus may be improved.

In addition, the pixel of the display apparatus may include the brightness boosting transistor Tb that applies the gate voltage of the first transistor T1 as the back bias voltage to the first transistor T1 in response to the brightness boosting signal HBM. Accordingly, the brightness of the image displayed by the display apparatus may be boosted.

Although the example embodiment of FIG. 5 describes that the gate electrode of the fourth transistor T4 and the gate electrode of the seventh transistor T7 receive the inverted scan signal from the (i−1)th inverted scan line /SL(i−1), the fourth transistor and the seventh transistor may be connected to different scan lines. In this case, the scan driver may include stages sets for respectively outputting the first scan signal, the second scan signal, the third scan signal, and the fourth scan signal as scan signals.

Although the example embodiment of FIG. 5 describes that the pixel PX-1 includes the first to seventh transistors, the pixel may have a variety of structures.

Figure 6:
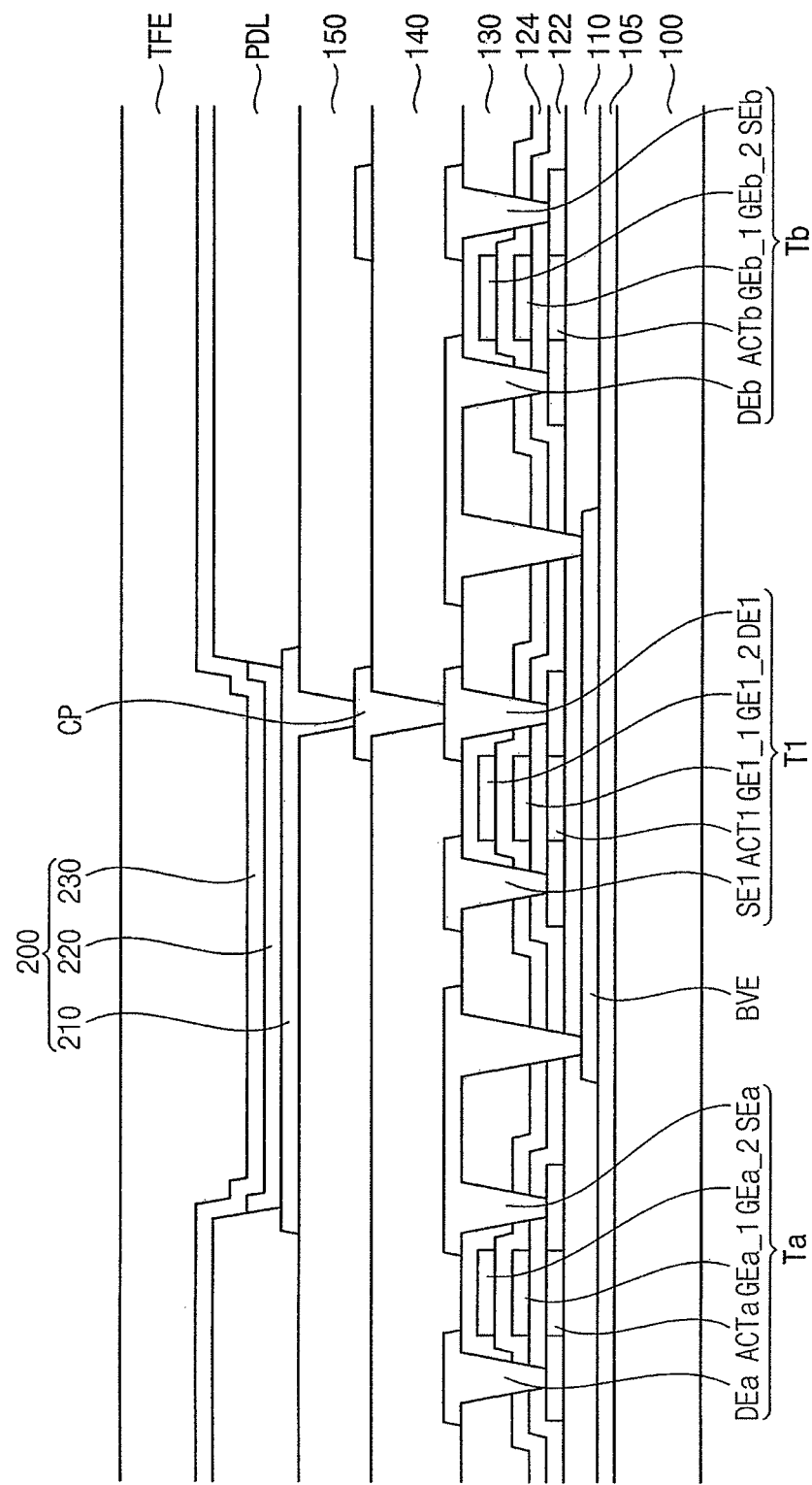
FIG. 6 illustrates a cross-sectional view of the display apparatus of FIG. 5.

FIG. 6 illustrates a cross-sectional view of the display apparatus of FIG. 5 according to an example embodiment.

Referring to FIG. 6, the display apparatus may be substantially the same as the display apparatus of FIG. 3 except that the display apparatus further includes a lower buffer layer 105, a second gate pattern layer, and a second source drain pattern layer. Therefore, repetitive description may be simplified or omitted.

The display apparatus may include the base substrate 100, the lower buffer layer 105, a back bias electrode BVE, the buffer layer 110, an active pattern layer, a first_first insulation layer 122, a first gate pattern layer, a first_second insulation layer 124, a second gate pattern layer, the second insulation layer 130, a first source drain pattern layer, the third insulation layer 140, a second source drain pattern layer, a forth insulation layer 150, the first electrode 210, the light emitting layer 220, the second electrode 230, and the thin film encapsulation layer TFE.

The lower buffer layer 105 may be disposed on the base substrate 100. The lower buffer layer 105 may be used to improve a flatness of a surface of the base substrate 110 when the surface of the base substrate 110 is not uniform. More than one buffer layer may be provided on the base substrate 110 according to a type of the base substrate 100.

For example, the buffer layer may include an organic material or an inorganic material.

The back bias electrode BVE may be disposed on the lower buffer layer 105. The buffer layer 110 may be disposed entirely on the base substrate 110 on which the back bias electrode BVE is disposed.

The active pattern layer may be disposed on the buffer layer 110. The active pattern layer may include a first active pattern ACT1, a color accuracy enhancement active pattern ACTa, and a brightness boosting active pattern ACTa.

The first_first insulation layer 122 may be disposed on the buffer later 110 on which the active pattern layer is disposed.

The first gate pattern layer may be disposed on the first_first insulation layer 122. The first gate pattern layer may include a first gate electrode GE1_1, a color accuracy enhancement gate electrode GEa_1, brightness boosting gate electrode GEb_1, and a signal line such as a scan line.

The first_second insulation layer 124 may be disposed on the first_first insulation layer 122 on which the first gate pattern layer is disposed.

The second gate pattern layer may be disposed on the first_second insulation layer 124. The second gate pattern layer may include a first upper gate electrode GE1_2, an upper color accuracy enhancement gate electrode GEa_2, an upper brightness boosting gate electrode GEb_2, and a signal line such as a second scan line. Here, the first upper gate electrode GE1_2 and the first gate electrode GE1_1 may form a capacitor.

The second insulation layer 130 may be disposed on the first insulation layer 120 on which the second gate pattern layer is disposed.

The first source drain pattern layer may include the first source electrode SE1, the first drain electrode DE1, the color accuracy enhancement source electrode SEa, the color accuracy enhancement drain electrode DEa, the brightness boosting source electrode SEb, the brightness boosting drain electrode DEb, and a signal wiring such as a data line.

The third insulating layer 140 may be disposed on the second insulating layer 130 on which the first source drain pattern layer is disposed.

The second source drain pattern layer may be disposed on the second insulating layer 130. The second source drain pattern layer may include a contact pad CP. The contact pad CP may be electrically connected to the first transistor T1 through a contact hole formed through the third insulating layer 140.

The fourth insulating layer 150 may be disposed on the third insulating layer 140 on which the second source drain pattern layer is disposed.

For the light emitting structure of the organic light emitting diode, the first electrode 210 may be disposed on the third insulating layer 140. The pixel defining layer PDL may be disposed on the fourth insulating layer 150 on which the first electrode 210 is disposed. The light emitting layer 220 may be disposed on the first electrode 210 exposed through an opening of the PDL. The second electrode 230 may be disposed on the pixel defining layer PDL and the light emitting layer 220.

The thin film encapsulation layer TFE may be disposed on the second electrode 230.

Figure 7:
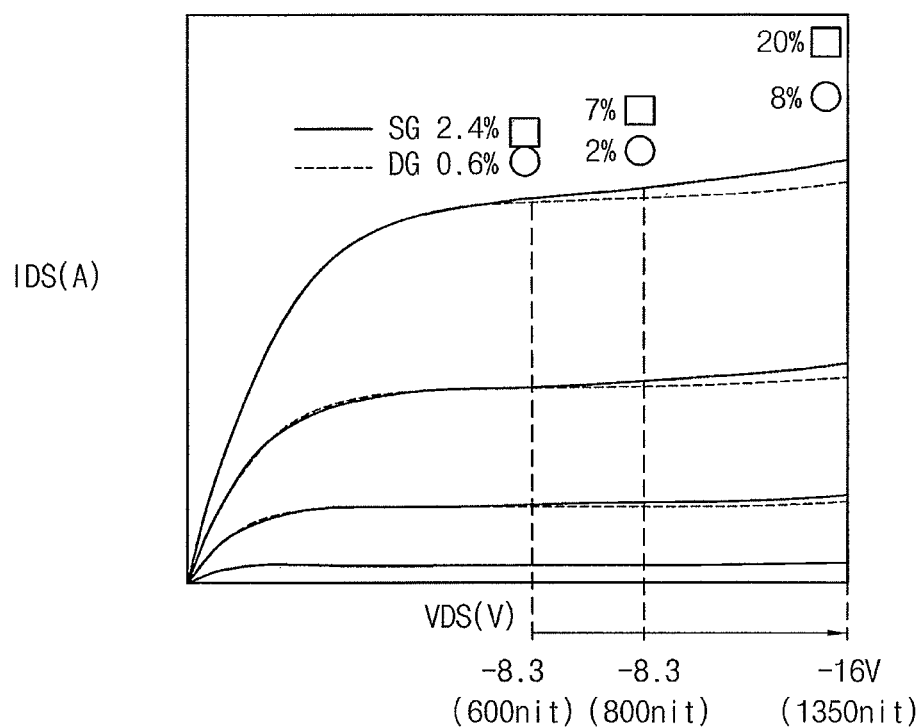
FIG. 7 illustrates a graph showing dispersion of a driving current according to change of a second power supply voltage and brightness in a normal mode and a color accuracy mode.

FIG. 7 illustrates a graph showing dispersion of a driving current according to change of a second power supply voltage and brightness in a normal mode and a color accuracy mode.

Referring to FIG. 7, the x-axis of the graph represents Vds (drain-source voltage) of a driving transistor, and the y-axis represents Ids (drain current) of the driving transistor. The four curves shown in the graph in the normal mode and the color accuracy mode represent curves for Vg (gate voltage) change.

In the normal mode (line SG), as Vds increases (absolute value of ELVSS increases, brightness increases), the degree of increase of Ids increases, and thus dispersion of Ion current value per pixel increases. (2.4% at ELVSS-8.3 V (600 nit), 7% at 800 nit, 20% at 1350 nit).

On the other hand, in the color accuracy mode (dotted line DG), the degree of increase of Ids with Vds increases is less, and the dispersion of the Ion current value per pixel is less. (0.6% at ELVSS-8.3 V (600 nit), 2% at 800 nit, 8% at 1350 nit).

That is, it may be seen that the color accuracy mode (DG of the graph) has a smaller drain conductance (slope) relative to the normal mode (SG of the graph). Therefore, the deviation in display quality due to the dispersion of the driving transistor characteristics for each pixel may be reduced.

Figure 8:
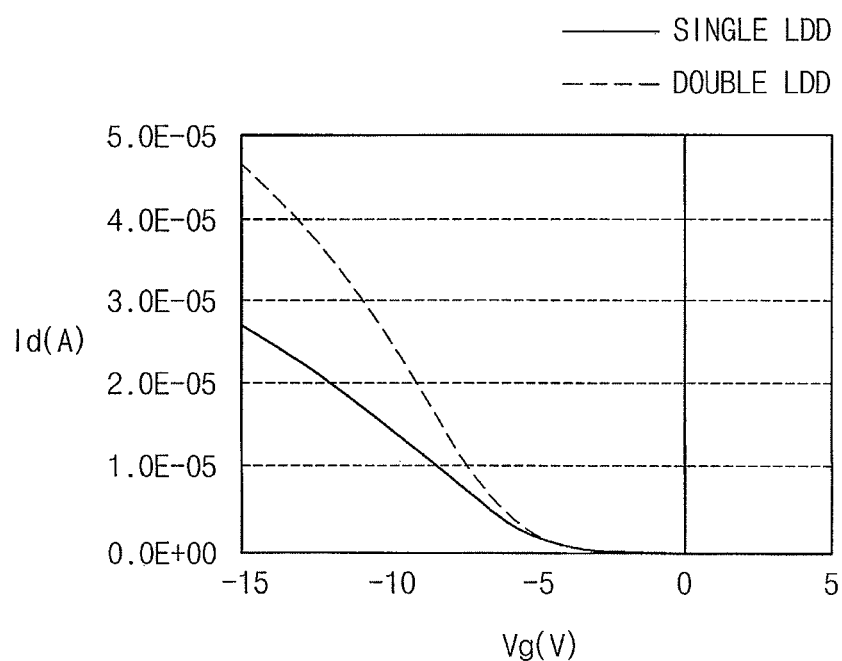
FIG. 8 illustrates a graph comparing drive current values in the normal mode and the high bright mode.

FIG. 8 illustrates a graph comparing drive current values in the normal mode and the high brightness mode.

Referring to FIG. 8, the x-axis of the graph represents Vg (gate voltage) of a driving transistor, and the y-axis represents Id (drain current) of the driving transistor.

It may be seen that the Id gradient according to Vg is larger in the high brightness mode (double LDD in the graph) than that of the normal mode (single LDD in the graph). That is, a large driving current is outputted for the same gate voltage, such that the brightness may be increased.

According to an example embodiment, a pixel of the display apparatus may include a color accuracy enhancement transistor Ta that applies a data signal or a first power supply voltage as a back bias voltage of the first transistor in response to a color accuracy enhancement signal. Accordingly, the color accuracy of the image displayed by the display apparatus may be improved.

In addition, the pixel of the display apparatus may include a brightness boosting transistor that applies a gate voltage of the first transistor as the back bias voltage to the first transistor in response to a brightness boosting signal. Accordingly, the brightness of the image displayed by the display apparatus may be increased.

According to an example embodiment, it may be possible to improve the display quality in the color accuracy mode and increase the brightness in the high brightness mode, and the color accuracy mode and the high brightness mode may be selected by user's choice or automatically selected according to surrounding environment.

By way of summation and review, an organic light emitting display apparatus may include a pixel having an organic light emitting diode (OLED). The OLED may emit light having a wavelength that depends on an organic material included in the OLED. For example, the OLED may include an organic material corresponding to one of a red color light, a green color light, and a blue color light. The organic light emitting display device may display an image using mixed light emitted by the organic materials.

According to an example embodiment, display quality of the organic light emitting display apparatus may be changed to improve the display quality of the organic light emitting display apparatus.

As described above, embodiments relate to a display apparatus capable of changing mode.

Embodiments may provide a display apparatus capable of switching between color accuracy mode and high brightness mode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a plurality of pixels, each of the plurality of pixels including:
an organic light emitting diode;
a first transistor providing a driving current to operate the organic light emitting diode;
a second transistor including a gate electrode that receives a first scan signal, a first electrode that receives a data signal, and a second electrode electrically connected to a first electrode of the first transistor;
a storage capacitor including a first electrode receiving a first power voltage and a second electrode electrically connected to a gate electrode of the first transistor; and
a color accuracy enhancement transistor that applies a first back bias voltage to the first transistor in response to a color accuracy enhancement signal.

2. The display apparatus as claimed in claim 1, wherein the color accuracy enhancement transistor includes a gate electrode, a first electrode, and a second electrode, and the first electrode receives a data signal or a first power voltage.

3. The display apparatus as claimed in claim 2, wherein the gate electrode of the color accuracy enhancement transistor receives the color accuracy enhancement signal, the first electrode of the color accuracy enhancement transistor is electrically connected to the first transistor, and the second electrode of the color accuracy enhancement transistor is electrically connected to a back bias electrode of the first transistor.

4. The display apparatus as claimed in claim 3, wherein the first electrode of the color accuracy enhancement transistor is electrically connected to the first electrode of the first transistor.

5. The display apparatus as claimed in claim 3, wherein each of the plurality of pixels further includes a brightness boosting transistor that applies a second back bias voltage to the first transistor in response to a brightness boosting signal.

6. The display apparatus as claimed in claim 5, wherein the brightness boosting transistor includes a gate electrode, a first electrode, and a second electrode, and the first electrode receives a gate voltage of the first transistor.

7. The display apparatus as claimed in claim 6, wherein the gate electrode of the brightness boosting transistor receives the brightness boosting signal, the first electrode of the brightness boosting transistor is electrically connected to the first transistor, and the second electrode of the brightness boosting transistor is electrically connected to the back bias electrode of the first transistor.

8. The display apparatus as claimed in claim 7, wherein the first electrode of the brightness boosting transistor is electrically connected to the gate electrode of the first transistor.

9. The display apparatus as claimed in claim 5, wherein:
when the color accuracy enhancement transistor is turned on by the color accuracy enhancement signal, the brightness boosting transistor is turned off by the brightness-boosting signal, and
when the brightness boosting transistor is turned on by the brightness-boosting signal, the color accuracy enhancement transistor is turned off by the color accuracy enhancement signal.

10. A display apparatus, comprising:
a plurality of pixels, each of the plurality of pixels including:
an organic light emitting diode;
a first transistor providing a driving current to operate the organic light emitting diode;
a second transistor including a gate electrode that receives a first scan signal, a first electrode that receives a data signal, and a second electrode electrically connected to a first electrode of the first transistor; and
a brightness boosting transistor that applies a second back bias voltage to the first transistor in response to a brightness boosting signal.

11. The display apparatus as claimed in claim 10, wherein the brightness boosting transistor includes a gate electrode that receives the brightness boosting signal, a first electrode electrically connected to the first transistor, and a second electrode electrically connected to a back bias electrode of the first transistor.

12. The display apparatus as claimed in claim 10, wherein a first electrode of the brightness boosting transistor receives a gate voltage of the first transistor.

13. The display apparatus as claimed in claim 10, wherein each of the plurality of pixels includes a color accuracy enhancement transistor that applies a first back bias voltage to the first transistor in response to a color accuracy enhancement signal.

14. A display apparatus, comprising:
a base substrate;
a back bias electrode on the base substrate;
a first transistor including a first active pattern overlapping the back bias electrode and a first gate electrode overlapping the first active pattern;
a first electrode electrically connected to the first transistor;
a second electrode facing the first electrode;
a light emitting layer disposed between the first electrode and the second electrode;
a color accuracy enhancement transistor electrically connected to the back bias electrode; and
a brightness boosting transistor electrically connected to the back bias electrode.

15. The display apparatus as claimed in claim 14, wherein the back bias electrode is electrically connected to a drain electrode of the color accuracy enhancement transistor and a drain electrode of the brightness boosting transistor.

16. The display apparatus as claimed in claim 14, further comprising a buffer layer disposed between the back bias electrode and the first transistor.

17. The display apparatus as claimed in claim 14, further comprising a mode selector that provides a color accuracy enhancement signal to a gate electrode of the color accuracy enhancement transistor, and provides a brightness boosting signal to a gate electrode of the brightness boosting transistor.

18. The display apparatus as claimed in claim 17, wherein:
the brightness boosting signal has an off voltage that turns off the brightness boosting transistor when the color accuracy enhancement signal has an on voltage that turns on the color accuracy enhancement transistor, and
the color accuracy enhancement signal has an off voltage that turns off the color accuracy enhancement transistor when the brightness boosting signal has an on voltage to turn on the brightness boosting transistor.

\* \* \* \* \*